United States Patent [19]
Nishizawa et al.

[11] Patent Number: 4,623,909
[45] Date of Patent: Nov. 18, 1986

[54] SEMICONDUCTOR PHOTODETECTOR

[75] Inventors: Jun-ichi Nishizawa, No. 6-16, Komegafukuro 1-chome, Sendai-shi, Miyagi; Takashige Tamamushi, Sendai, both of Japan

[73] Assignee: Jun-ichi Nishizawa, Miyagi, Japan

[21] Appl. No.: 584,351

[22] Filed: Feb. 28, 1984

[30] Foreign Application Priority Data

Feb. 28, 1983 [JP] Japan ................... 58-30928

[51] Int. Cl.⁴ ............ H01L 27/14; H01L 29/80; H01L 31/00
[52] U.S. Cl. ................ 357/30; 357/22; 357/23.1; 357/23.4; 357/41; 357/45
[58] Field of Search ........... 357/30, 22, 22 E, 40, 357/45, 41, 23.6, 23.11, 23.1, 23.4

[56] References Cited
U.S. PATENT DOCUMENTS

| | | | |
|---|---|---|---|
| 4,364,072 | 12/1982 | Nishizawa | 357/55 X |
| 4,427,990 | 1/1984 | Nishizawa | 357/23.4 |
| 4,470,059 | 9/1984 | Nishizawa et al. | 357/23.4 |
| 4,521,795 | 6/1985 | Coe et al. | 357/23.4 |

Primary Examiner—James W. Davie
Assistant Examiner—Georgia Y. Epps
Attorney, Agent, or Firm—Sughrue, Mion, Zinn, Macpeak, and Seas

[57] ABSTRACT

An improved semiconductor photodetector of a type implemented with static induction transistors, and a method for driving such a device, in which data can be read out in a nondestructive mode. The static induction transistors of which the semiconductor photodetector is composed each include a gate region which forms boundaries with a channel region and in which carriers generated in response to incident light are accumulated. A structure for suppressing the depletion of carriers accumulated in the gate regions during reading of data is provided for each of the gate regions. This structure may take the form of an insulating layer which forms a potential barrier along the boundary between the gate regions and the channel region.

8 Claims, 18 Drawing Figures

SEMICONDUCTOR PHOTODETECTOR

BACKGROUND OF THE INVENTION

The present invention relates to a semiconductor photodetector using SITs (Static Induction Transistors), and to a method for driving the same. More particularly, the invention relates to an improvement in such a photodetector for providing nondestructive data readout.

A basic semiconductor photodetector using SITs to form a solid-state image pickup device is disclosed in Japanese Laid-Open Patent Application No. 15229/1980. Improvements of that device have been disclosed, for instance, in Japanese Patent Application No. 204656/1981.

In such an SIT semiconductor photodetector, carriers produced by incident light are not directly outputted as data. More specifically, data is read out in such a photodetector by varying the source-drain current of the SITs according to the amount of carriers accumulated during a reading operation. Thus, a semiconductor photodetector of this type has a feature that the data can be read out nondestructively. This nondestructive readout is effective in the optical detection of still pictures using a line sensor or an image sensor.

In a conventional photodetector composed of SITs, especially a photodetector in which a plurality of SITs are arranged one or two dimensionally, carriers produced by incident light are accumulated in the gate region (in the control gate region in the case of a gate division type photodetector), and current is caused to flow between the source and the drain by applying a voltage to the gate region. The voltage applied to the gate region causes carriers accumulated therein to be discharged into the channel region. If a voltage is applied to the gate for a sufficiently long time or a sufficient number of times, the carriers will be depleted. It is considerably difficult to maintain conditions such as a magnitude and a pulse width for the data reading voltage applied to the gate region to retain a sufficient charge in the gate region, which makes it difficult to read out the data in a nondestructive mode.

Accordingly, an object of the invention is to provide a semiconductor photodetector in which the above-described difficulties accompanying a conventional semiconductor photodetector have been eliminated and data can be satisfactorily read out in a nondestructive mode. The invention further relates to a method for driving such a semiconductor photodetector.

SUMMARY OF THE INVENTION

In accordance with the above and other objects, in a semiconductor photodetector according to the invention, each gate region is provided with means for suppressing the depletion of carriers accumulated in reading data.

In one preferred embodiment of the invention, the suppressing means is a potential barrier provided by an insulating layer which is formed along the boundary of each gate region and the channel region.

In another preferred embodiment of the invention, the suppressing means is a potential barrier to which is applied a potential generated in the gate region after a voltage for eliminating carriers accumulated in the gate region has been applied to the potential barrier which is provided by the insulating layer.

In a method for driving the semiconductor photodetector according to the invention, a reset signal is applied to each gate region, the reset signal forming a potential in the gate region which depletes carriers against a potential barrier which is formed in the gate region in order to suppress the depletion of carriers due to the application of a data reading signal. The reset signal may be applied to all one- or two-dimensionally arranged SITs after all the data of the SITs has been read out. Otherwise, the reset signal may be applied to all SITs in a two-dimensional arrangement after all video data lines in the photodetector has been read out.

DESCRIPTION OF THE PREFERRED EMBODIMENTS

Examples of a semiconductor photodetector device constructed according to the invention and examples of a method for driving a semiconductor photodetector according to the invention will be described with reference to the accompanying drawings.

Figure 1A:
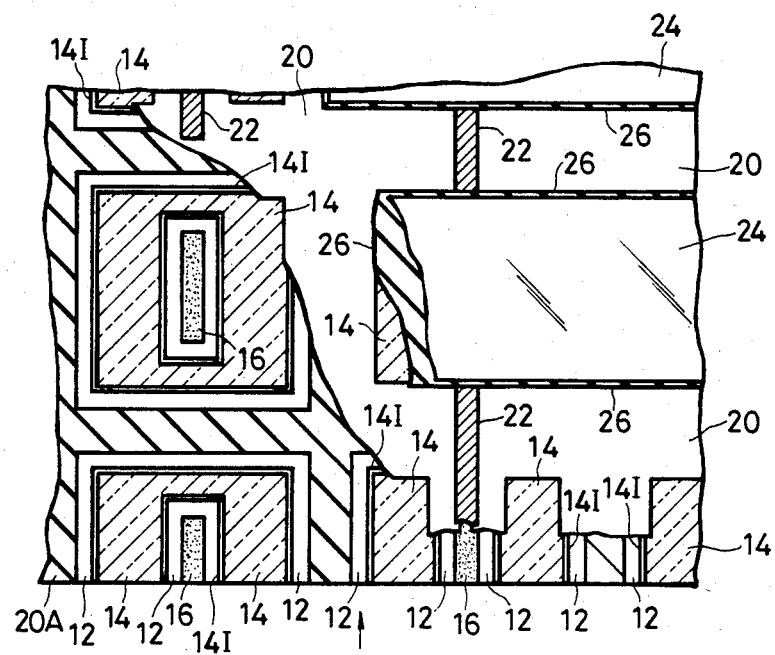
FIG. 1A is a plan view, with parts cut away, showing an example of a semiconductor photodetector constructed according to the invention, implemented as an image pickup device.
Figure 1B:
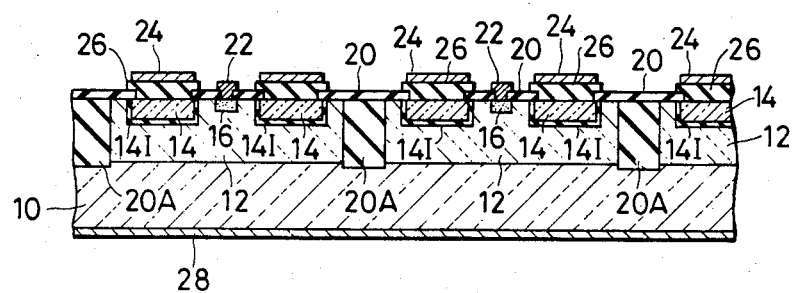
FIG. 1B is an end elevational view taken in the direction of an arrow I in FIG. 1A.
Figure 2:
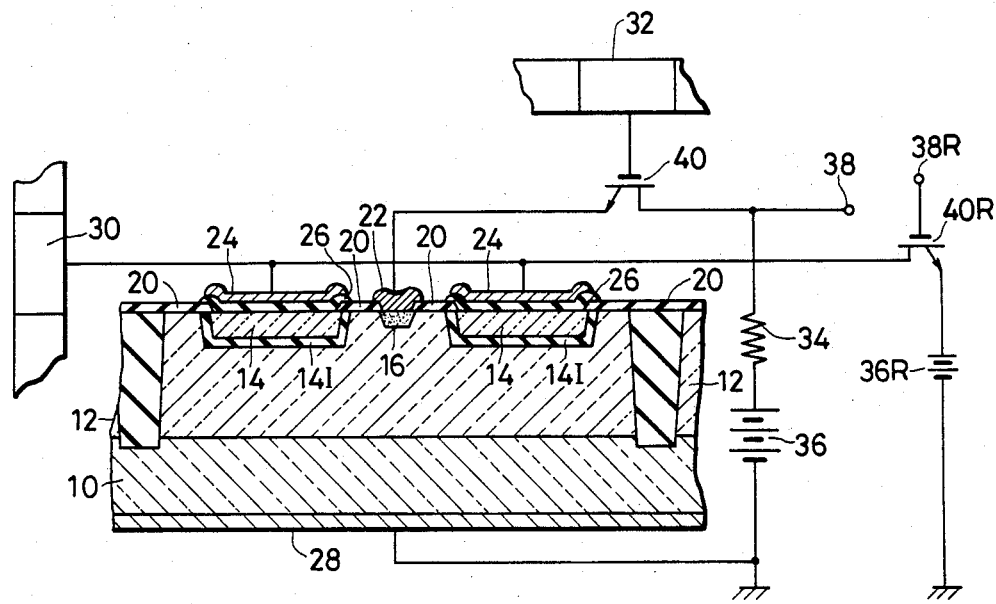
FIG. 2 is an enlarged end elevational view of one cell.

FIGS. 1A and 1B show an example of an image pickup device implemented as a semiconductor photodetector with SITs according to the invention. This example is of nondivision gate type, that is, an image pickup device in which the gate regions are not divided. FIG. 1A is a plan view of the device with parts cut away, and FIG. 1B is an end elevational view as viewed in the direction of the arrow I in FIG. 1A. For simplication in illustration, in FIG. 1B, connections between cells are not shown. FIG. 2 is an enlarged and elevational view of a cell in FIG. 1B which corresponds to one picture element.

Channel regions 12, which are low impurity density $n^-$ layers, are formed on an $n^+$ substrate 10. The semiconductor material of the substrate 10 may be silicon. $p^+$ gate regions 14 are formed on the channel regions 12, that is, on the $n^-$ layers. A source region 16 is formed inside the gate region in such a manner that the channel region 12 is located between the source region 16 and the gate region 14. The gate regions 14 and the source regions 16 are arranged at regular intervals and in a two-dimensional matrix form. Each set of gate and source regions 14 and 16 forms a cell corresponding to one picture element.

An insulating isolating $SiO_2$ layer is formed between adjacent gate regions 14 so that the cells are isolated from one another. A surface protective $SiO_2$ layer 20 is formed between adjacent gate regions 14 so that the cells are isolated from one another. The surface protective $siO_2$ layer 20 is formed on the upper surface of the $n^-$ layer in which the channel regions 12 are formed, except for the exposed parts of the gate and source regions 14 and 16. Source electrodes 22 are formed on the exposed parts of respective source regions 16 with the electrodes 22 (FIG. 1A) of adjacent cells being connected together. A transparent gate electrode 24 is formed on an insulating layer 26 which is provided on the exposed parts of the gates regions 14. The insulating layer 26 extends over the source electrode 22. The electrode 24 is formed on the insulating layer 26. Thus, a capacitor is formed between the gate region 14 and the gate electrode 24 with a portion of the insulating layer 26 forming the dielectric of the capacitor. The source electrode 22 is insulated from the gate electrode 24 by the insulating layer 26. The interconnecting lines of the gate electrodes 24 and those of the source electrodes 22 cross each other. When one of the source electrodes 22 and one of the gate electrodes 24 are selected, the cell which is at the intersection of the two electrodes is thereby selected. Drain electrodes 28 are formed on the side of the substrate opposite the side where the channel regions 12 are formed.

An insulating layer 14I is formed between each gate region 14 and the adjacent channel regions 12. That is, each gas region 14 is surrounded by the insulating layers 14I and 26. The insulating layers 14I and 26 are preferably made of $SiO_2$, SiN, $Si_3N_4$ or $Ta_2O_5$. The thickness of the insulating layers 26 is, for instance, 300 Å to 1000 Å, while the thickness of the insulating layers 14I is preferably, for instance, also 300 Å to 1000 Å, although it may be less than 300 Å in some instances. The thickness of the insulating layers 14I affects the movement of carriers. It is considered that if the thickness is 300 Å or larger, carriers pass through the layers by an avalanche effect, and in the case where the thickness is less than 300 Å, carriers pass through the layers by a field effect or tunneling effect. In the case when avalanching occurs, the cells may be lower in performance or they may be damaged, and therefore it is necessary to take suitable countermeasures. The thickness of the insulating layers 14I affects the selection of the reset voltage.

Figure 3:
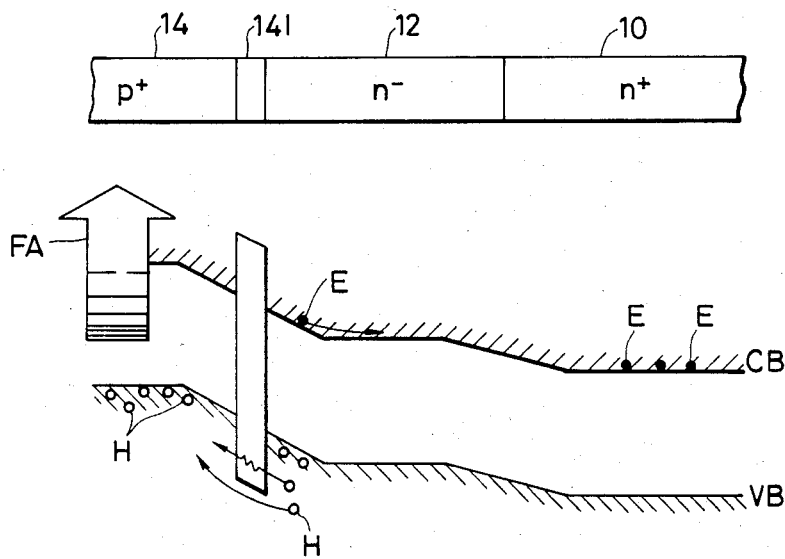
FIG. 3 is an energy band diagram for the device of FIGS. 1A and 1B.

FIG. 3 is an energy band diagram showing energy levels from the $n^+$ substrate 10 to the $p^+$ gate region 14. FIG. 3 will be described in more detail below.

Figure 4A:
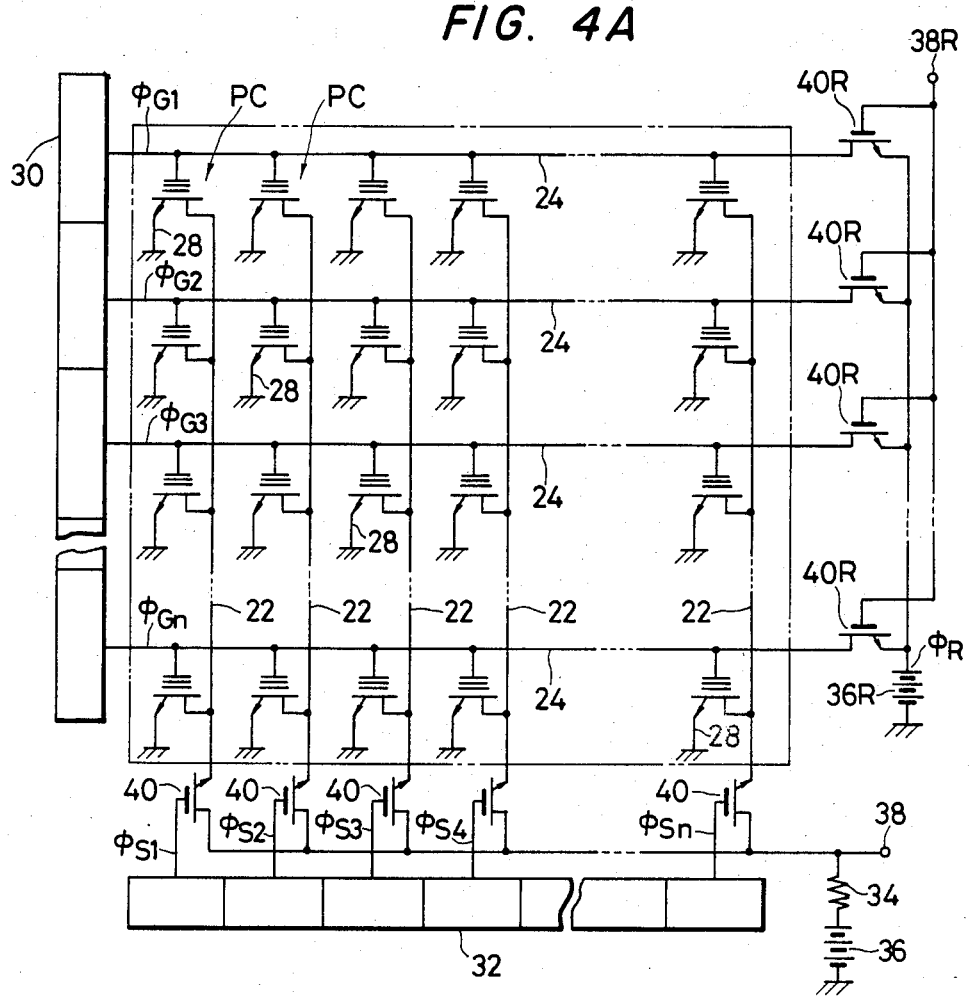
FIG. 4A is a circuit diagram showing an electrical equivalent circuit of a semiconductor photodetector device of the invention implemented as a two-dimensional image pick-up device.

An equivalent circuit of the image pickup device having the above-described structure, the connection of the electrodes, and the connection of a drive structure will now be described. More specifically, FIG. 4A shows the connection of the device to an external circuit. Some of these connections are shown in FIG. 2 as well.

Figure 4B:
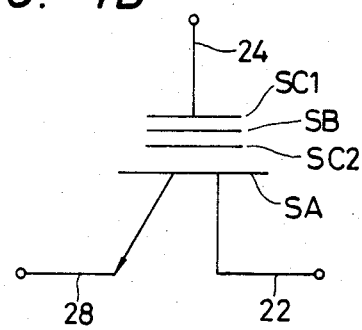
FIG. 4B is an explanatory diagram used for a description of symbols seen in FIG. 4A.

First, symbols representing the cells in FIG. 4A will be described with reference to FIG. 4B. In FIG. 4B, reference character SA designates a channel to which the source electrode 22 and the drain electrode 28 are connected; SB, the gate region 14; SC1, the capacitor which is formed by the insulating layer 26, which capacitor SC1 is connected to the gate electrode 24; and SC2, the capacitor which is formed by the insulating layer 14I.

In FIG. 4A and FIG. 2, reference character PC designates cells corresponding to picture elements, the cells PC being arranged in two-dimensional matrix form as shown in more detail in FIG. 1A. A read address circuit 30 is connected to a plurality of common gate electrodes 24 to apply reading pulses to the horizontal lines in sequence. Further, a plurality of common source electrodes 22 are connected to the drains of respective switching transistors 40, the sources of which are connected to an output terminal 38. The gates of the transistors 40 are connected to a video line selecting circuit 32. The video line selecting circuit 32 applies selection pulses to the transistors 40 to drive the latter in sequence.

Each transistor 40 is an SIT which is normally nonconductive. The read address circuit 30 and the video line selecting circuit 32 can be implemented with shift registers. An output resistor 34 and a power source 36 are connected between the output terminal 38 and ground, that is, between the output terminal 38 and the drain electrodes 28. These components form a data reading circuit.

A circuit for depleting carriers accumulated in the gate region 14 of each cell PC, namely, a resetting circuit, will be described. A plurality of common gate electrodes 24 are connected to the sources of resetting transistors 40R, respectively, the drains of which are grounded through a power source 36R. The gates of the transistors 40R are connected to a reset pulse applying terminal 38R.

Figure 5:
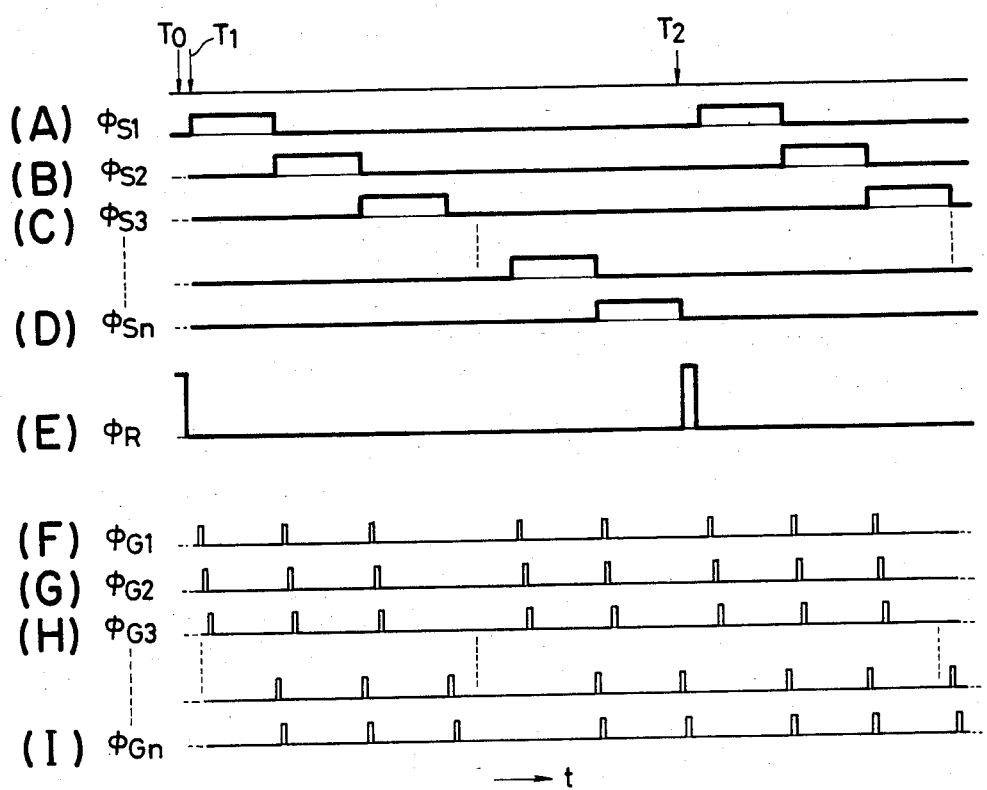
FIG. 5 is a timing chart used in a description of a method for driving the image pickup device.

The operation of the above-described device will be described with reference to FIGS. 1A through 5. FIG. 5 is a timing chart showing signals applied to the image pickup device in operation.

At the time instant $T_0$ immediately after a reset pulse $\phi_R$ (FIG. 5) is applied, holes H (FIG. 3) which have been accumulated in the gate region 14 are depleted. The gate region 14 is a $p^+$ layer. Therefore, when the gate region 14 is in ordinary or neutral state, holes H are present therein. These holes are also depleted, that is, the gate region 14 is equivalently negatively charged. In other words, both bands CB (Conduction Band) and VB (Valence Band) are shifted in the direction of the arrow FA. Accordingly, a considerably large potential difference occurs between the channel region 12 and the gate region 14, which are separated by the insulating layer 14.

When, under this condition, light is applied to the cells PC for a suitable period of time (the time instant $T_0$ to the time instant $T_1$), some electrons E and some holes H are paired, while some electrons E and some holes H are separated by the potential slope which is formed over the channel region 12 and the gate region 14 as shown in FIG. 3. The electrons E move along the conduction band CB towards the drain electrode 28, while the holes H move along the valence band towards the gate region 14. The holes H are affected by the above-described large potential difference, that is, a strong electric field acts on the holes H. Hence, holes are accumulated in the gate region 14 by injection with a tunnel or field effect or an avalanche phenomenon depending on the thickness of the insulating layer 14I. Thus, holes is an amount which corresponds to the magnitude of the incident light are accumulated in the gate region 14 of each cell PC.

During the period of time of from the time instant $T_1$ to the time instant $T_2$, the video line selection circuit 32 applies selection pulses $\phi_{S1}$ through $\phi_{Sm}$ in sequence to the transistors 40 coupled to the source electrodes 22. As a result, desired ones of the transistors 40 are rendered conductive so that, of the cells PC in FIG. 4A, those which are on desired rows have their source electrodes 22 and drain electrodes 28 coupled through the resistor 34 to the power source 36. Thus, source-drain current flows are enabled. By the above-described operation, video lines for reading picture data are selected.

Further, the read address circuit 30 applies the pulses $\phi_{G1}$ through $\phi_{Gn}$ to the gate electrodes 24 in sequence. As a result, the cells PC on the selected video lines are succesively driven so that source-drain currents corresponding to the amounts of holes accumulated in the gate regions 14, and hence the intensity of the light incident thereon, flow in the resistor 34, thus generating output voltages at the output terminals.

The magnitude of the pulses $\phi_{G1}$ through $\phi_{Gn}$ is such that the holes H accumulated in the gate regions 14 are not depleted in the channel regions 12; that is, the magnitude of the pulses $\phi_{G1}$ through $\phi_{Gn}$ is smaller than that of the reset pulse $\phi_R$, for instance, about 1.5 V. The magnitude of the reset pulse $\phi_R$ should be set according to the thickness of the insulating layer 14I.

At the time instant $T_2$, the scanning of one field has be accomplished, and the reset pulse $\phi_R$ is applied to all the cells PC through the terminal 38R again, whereupon the holes H accumulated in the gate regions 14 are depleted and conditions are established for the next operation to begin.

The above-described operations are repeatedly carried out so that picture data corresponding to the incident light is provided as voltage variations at the output terminal 38.

Another example of a photodetector of the invention will be described with reference to FIGS. 6A through 9. This embodiment utilizes divided gate type SITs in which the gates are divided into control gates and shielding gates. In these figures, those components which have been previously described with reference to FIGS. 1A through 5 are designated by the same reference numerals or characters, and detailed descriptions thereof are omitted.

Figure 6A:
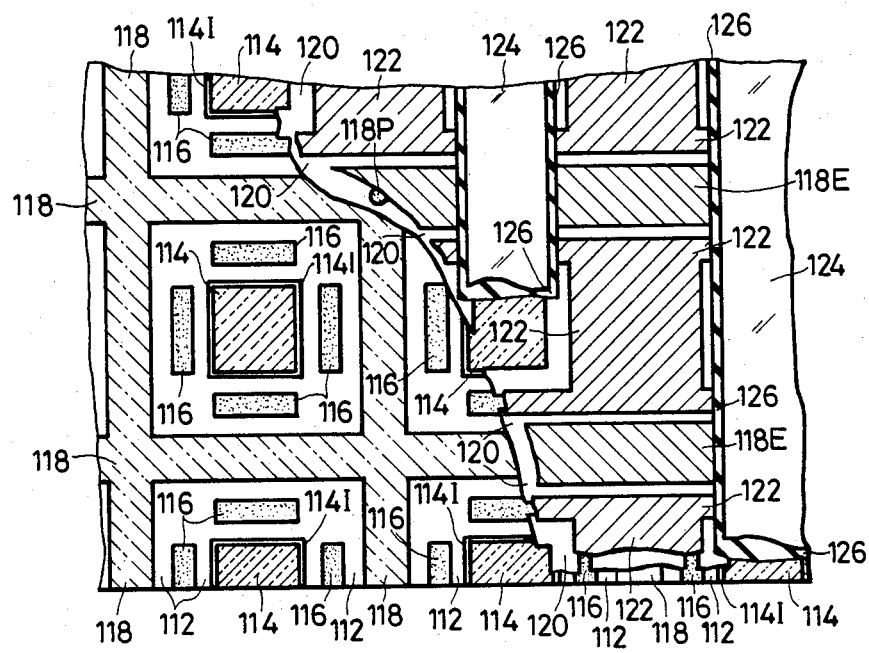
FIG. 6A is a plan view, with parts cut away, showing another example of an image pickup device of the invention.
Figure 6B:
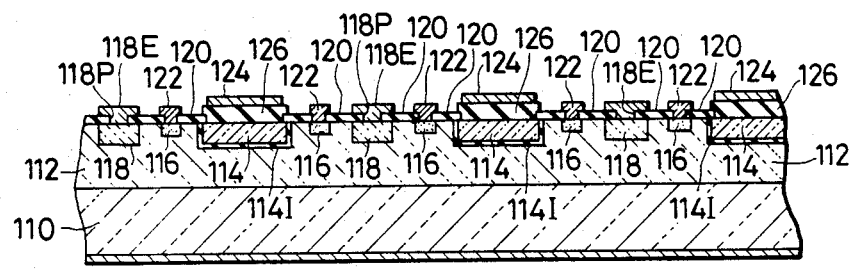
FIG. 6B is an end elevation as viewed in the direction of an arrow VI in FIG. 6A.
Figure 7:
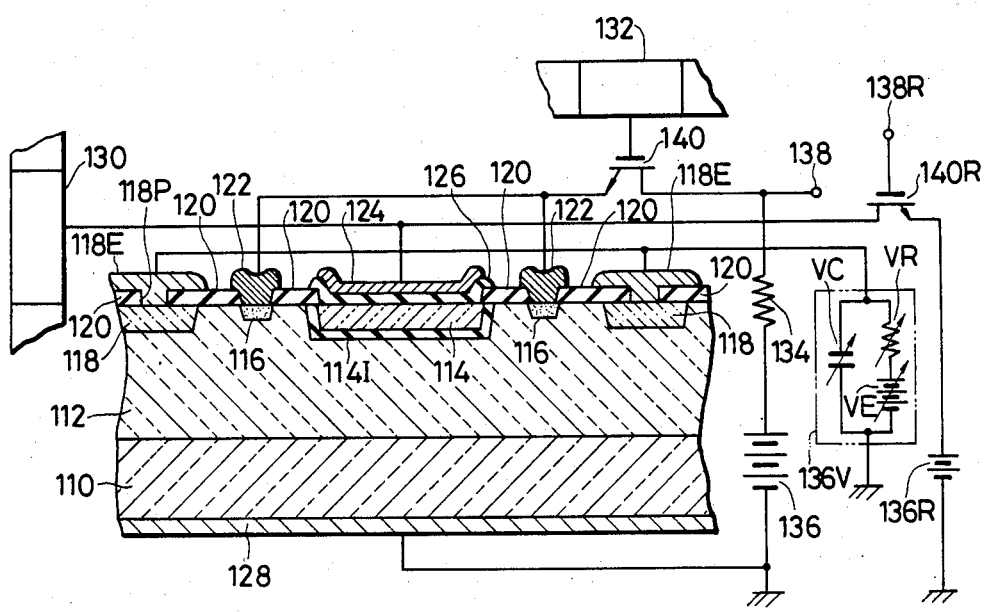
FIG. 7 is an enlarged sectional view showing one cell of FIG. 6B.

FIG. 6A is a plan view, with parts cut away, of the image pickup device of the second embodiment, and FIG. 6B is an end elevation as viewed in the direction of the arrow VI in FIG. 6A. In the device of FIG. 6B, as in the first described embodiment, connections between cells are not shown for simplification in illustration. FIG. 7 is an enlarged view showing in cross section a cell corresponding to a picture element of FIG. 6B.

As shown in FIGS. 6A, 6B, and 7, an $n^-$ channel region 112 is formed on an $n^+$ Si substrate 110. $p^+$ control gate regions 114 are formed in the upper surface of the $n^-$ channel region 112. $n^+$ source regions 116 are formed around each control gate region 114. The control gates 114 and source regions 116 are arranged regularly at suitable intervals in two-dimensional matrix form. One control gate region 114 and four source regions 116 form one cell, corresponding to one picture element. A $p^+$ shielding gate region 118 is formed between adjacent source regions 116. An insulating layer 114I is formed along the boundary of each control gate region 114 and the channel region 112. The shielding gate regions 118 have shielding gate electrodes 118E to which suitable voltages are applied.

The $n^-$ channel region 112 is covered with a surface protective film 120 of $SiO_2$ or the like, except for the area of the control gate regions 114, the source regions 116, and the exposed parts 118P of the shielding gate regions 118. Source electrodes 112 are connected to the exposed parts of the source regions 116 to interconnect the source regions of adjacent cells. In other words, the lines which interconnect the source electrodes 122 cross the control gate electrodes (described in more detail below), as shown in FIG. 6A.

A transparent control gate electrode 124 is formed through an insulating layer 126 on the exposed parts of a certain number of the control gate regions 114 arranged in each column. Each insulating layer 126 is made of $SiO_2$, for instance, and extends over the source electrodes 122. Each control gate electrode 124 is formed on the insulating layer 126 as described above. A capacitor is formed by the control gate electrode 124 and the control gate regions 114 with the insulating layer 126 as a dielectric. The source electrodes, the shielding gate electrodes E, and the control gate electrodes 124 are insulated from one another.

When one of the source electrodes 122 and one of the control gate electrodes 124 are selected, the cell at the intersection of the two selected electrodes is selected. A drain electrode 128 is formed on the side of the substrate 110 opposite the side where the $n^-$ channel region 112 is formed. The shielding gate electrodes 118E are connected together (the connection not being shown). A predetermined voltage is applied to all the shielding gate regions 118 via this connection.

An equivalent circuit of the image pickup device constructed as described above, the connection of the electrodes and the connection of drive device will now be described.

Figure 8:
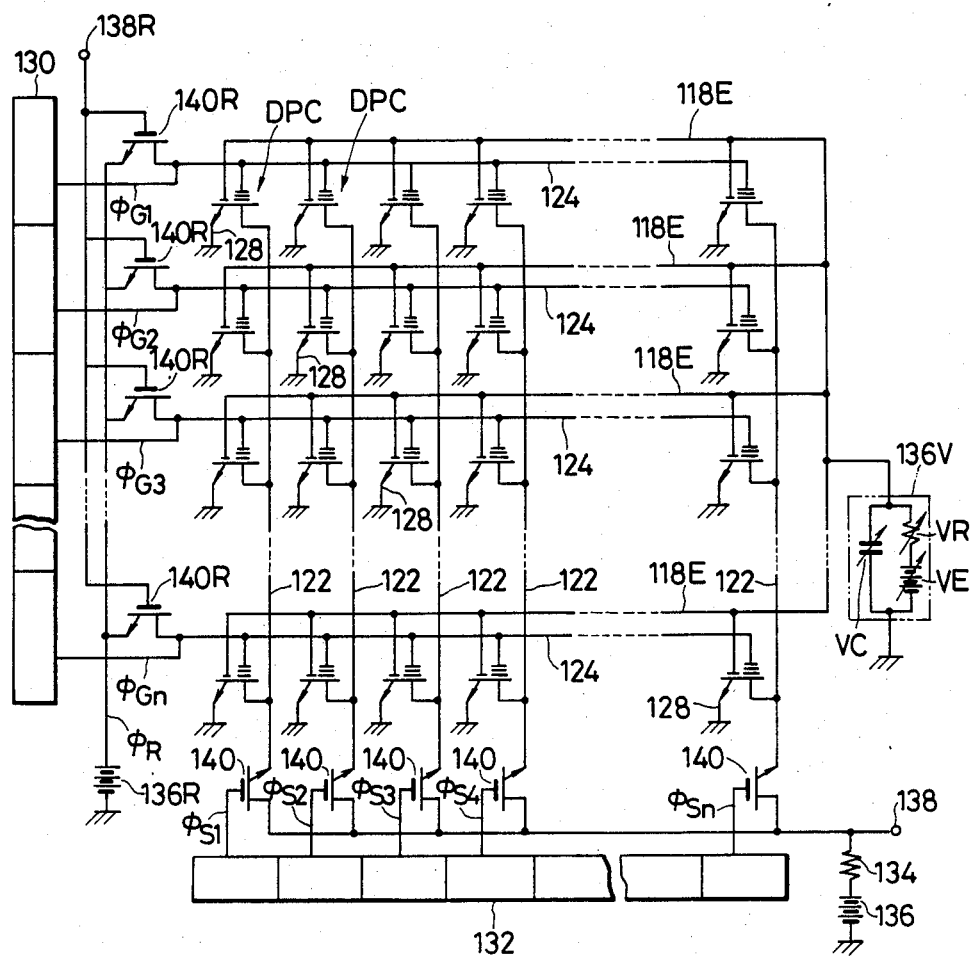
FIG. 8 is a circuit diagram showing an electrical equivalent circuit of the image pickup device in FIG. 6 which is realized as a two-dimensional image pickup device.
Figure 9:
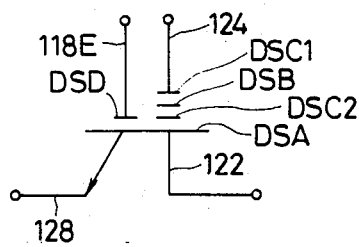
FIG. 9 is an explanatory diagram for a description of symbols used in FIG. 8.

FIG. 8 shows the connection of the electrical circuit and external devices. A part of the connection is shown in FIG. 7 also. First, symbols indicative of the cells shown in FIG. 8 will be described with reference to FIG. 9. In FIG. 9, reference character DSA designates the channel to which the source electrode 122 and the drain electrode 128 are connected; DSB, the control gate region 114; DSC1, the capacitor which is formed with the insulating layer 126 as a dielectric; DSC2, the capacitor which is formed with the insulating layer 114I as a dielectric and DSD, the shielding gate region 118 to which the shielding gate electrode 118 E is connected.

In FIG. 8, reference character DPC designates the cells, which correspond to picture elements, with the cells DPC being arranged in two-dimensional matrix form as shown in FIG. 6A. A plurality of common control gate electrodes 124 are connected to the drains of switching transistors 140R for every video line. The sources of the transistors 140R are connected to a common power source 136R. The gates of the transistors 140R are connected to a reset pulse applying terminal 138R, and the drains are further connected to a read address circuit 130.

Common source electrodes 122 are connected to the drains of switching transistors 140 in respective columns, and the sources of the transistors 140 are connected to an output terminal 138. The gates of the transistors 140 are connected to a video line selecting circuit 132, which applies selection pulses to the transistors 140 to drive the transistor 140 in sequence. The transistors 140 and 140R are SITs which are normally nonconductive. The read address circuit 130 and the video line selecting circuit 132 may be implemented with shift registers.

An output resistor 134 and a power source 134 are connected between the output terminal 138 and ground, that is, between the output terminal 138 and the drain electrodes 128. A variable power source 136V is connected to the shielding gate electrodes 118 of the cells DPC. The variable power source 136V may be implemented, for instance, with a variable resistor VR, a variable voltage power source VE and a variable capacitor VC.

The operation of the device shown in FIG. 8 is essentially the same as that of the device of FIG. 4A, and hence the timing chart of FIG. 5 correctly depicts the signals $\phi_{S1}$ through $\phi_{Sm}$, $\phi_R$ and $\phi_{G1}$ through $\phi_{Gn}$ indicated in FIG. 8.

The voltage which is applied to the shielding gate regions 118 by the variable power source 136V is used to provide a potential reference when the above-described data is read out. Variation of this value allows the output characteristic to be varied.

Figure 10:
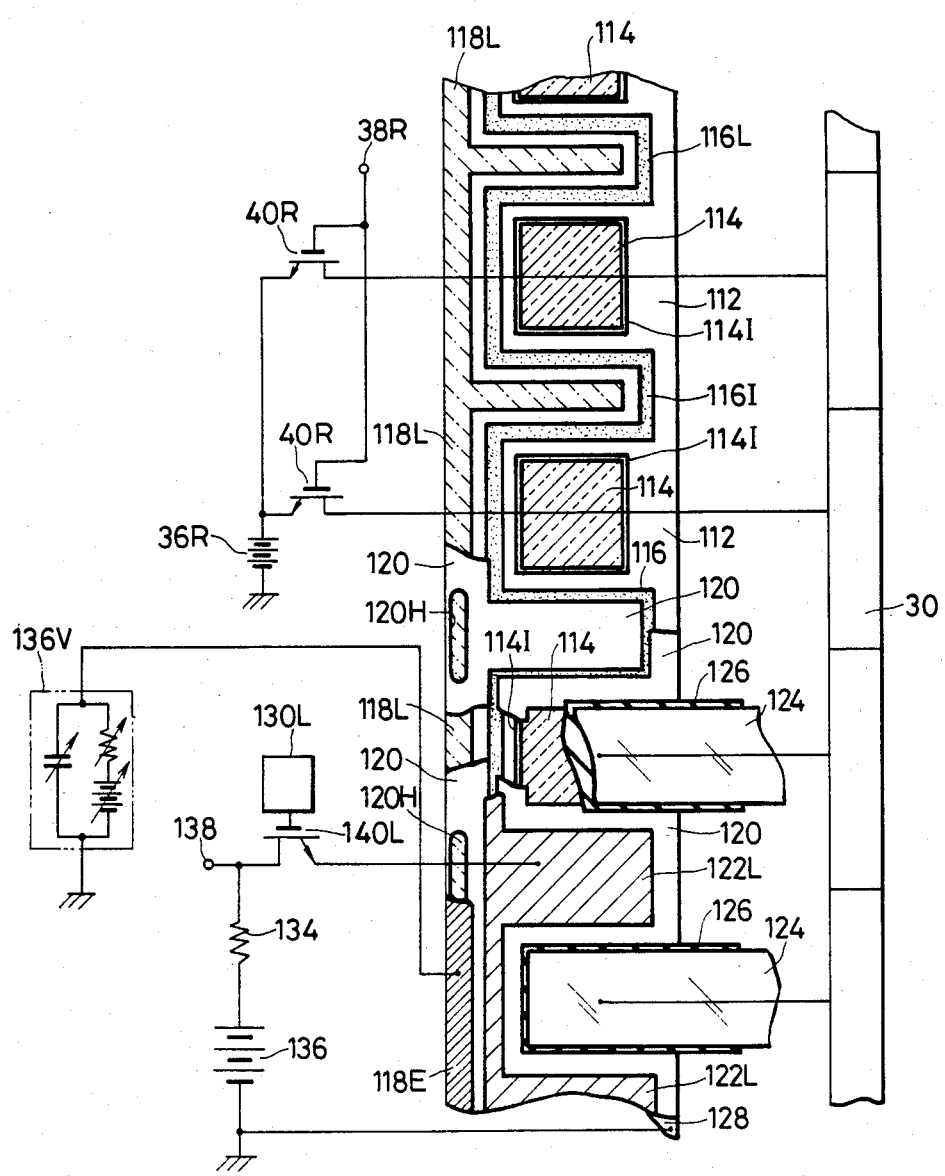
FIG. 10 is a plan view, with parts cut away, showing an example of a line sensor according to the invention.

FIG. 10 shows another embodiment of the invention, in this case, a line sensor. In FIG. 10, those elements which have been described with reference to FIGS. 1A through 9 are designated by the same reference numerals or characters, and detailed descriptions thereof are omitted.

In this embodiment, a common source region 116L and a common source electrode are provided in common for all the cells. Similarly, a common shielding gate region 118L is provided for all the cells. However, it should be noted that a part of the periphery of each control gate region 114 is not covered by the shielding gate region 118L.

Because a line sensor, unlike an image pickup device, needs no video line selection, the line sensor has a much simpler construction. Accordingly, it is not always necessary for the line sensor to be provided with the video line selecting circuit 132L and the transistors 140L; however, the circuit 132L and the transistors 140L are shown in FIG. 10 for comparison with the above-described embodiment.

Figure 11A:
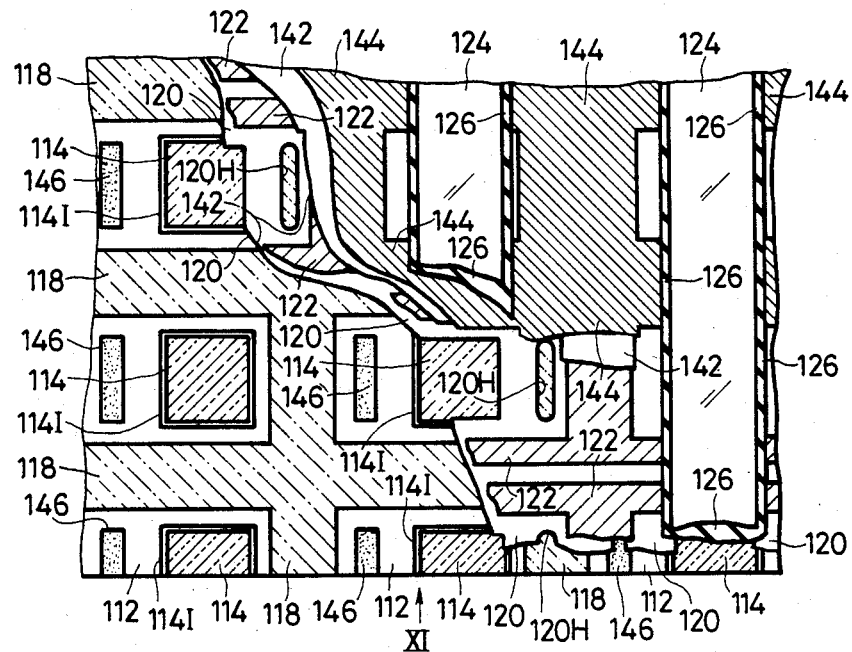
FIG. 11A is a plan view, with parts cut away, showing another example of an image pickup device.
Figure 11B:
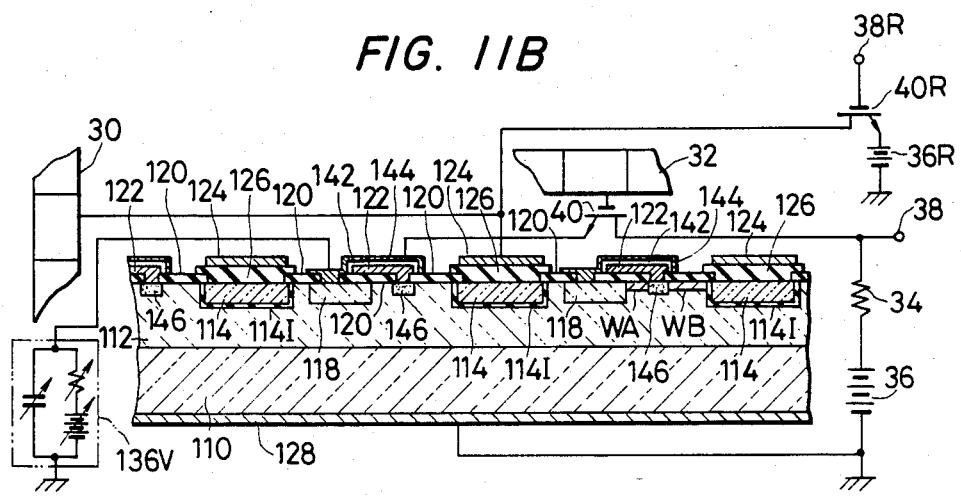
FIG. 11B is an end elevational view as viewed in the direction of an arrow XI of the device of FIG. 11A.

Another embodiment of a photodetector of the invention, one which is designed to prevent the accumulation of carriers in the shielding gate regions, will be described with reference to FIGS. 11A and 11B. FIG. 11A is a plan view, with parts cut away, showing such a device, in a view similar to FIG. 1A, and FIG. 11B is an end elevation viewed in the direction of the arrow XI, similar to the view of FIG. 1B. In FIGS. 11A and 11B, those components which have been previously described are again designated by the same reference numerals or chararcter, and detailed descriptions thereof are omitted.

In the embodiment of FIGS. 11A and 11B, the source regions 146 are positioned near the shielding gate region 118. That is, the relation $W_A < W_B$ is established, where $W_A$ is the distance between each source region 146 and the shielding gate region 118, and $W_B$ is the distance between the source region 146 and the control gate region 114. In this structure, the lowest potential position in the source region 146, namely, the true gate position, is moved towards the shielding gate region 118, and hence holes H are effectively accumulated in the control gate region 114.

In this embodiment, an aluminum light shielding layer 144 is formed upon an insulating layer 142 on the source regions 146 and the shielding gate regions 118. Accordingly, no light can enter the channel region 112 through the shielding gate regions 118, and therefore the accumulation of carriers (holes H in this embodiment) is carried out with respect to the shielding gate regions 118. The light shielding layer 144, which is connected via through holes 120H in an oxide layer 120 to the shielding gate regions 118, serves as a shielding gate electrode. In this embodiment, the light shielding layer 144 is formed on the upper surfaces of the control gate electrodes 124; however, it may be formed on the lower surface of the control gate elctrodes 124.

In the above-described embodiment, the cells are effectively separated from one another. However, the separation of the cells can be improved by forming the shielding gate regions 118 deeper in the channel region 112 than the control gate regions 114, or by making the impurity density of the shielding gate regions 118 higher than that of the control gate regions 114. Employment of at least one of the above-described techniques can improve the separation of the cells so that the number of cells in a given area can be considerably increased.

Figure 12:
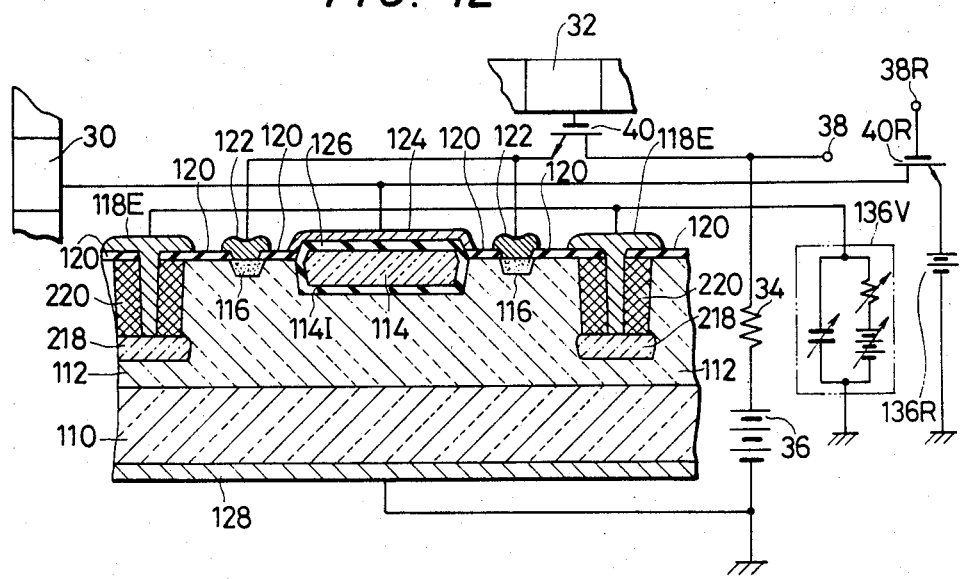
FIG. 12 is a sectional view showing another example of a semiconductor photodetector device constructed according to the invention.

FIG. 12 shows another embodiment of the invention. In this embodiment, in order to suppress the accumulation of carriers due to incident light thereby to more effectively separate the cells from one another, the shielding gate regions 218 are buried deep in the channel region 112, and an insulating layer 220 is formed between each shielding gate region 218 and the surface of the channel region 112.

Figure 13:
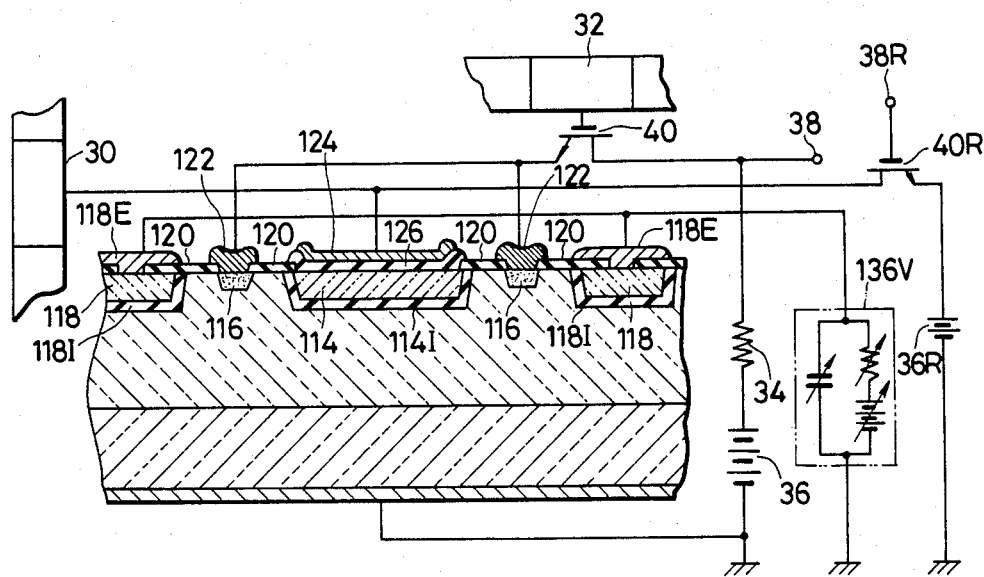
FIG. 13 is a sectional view showing still another example of a semiconductor photodetector device according to the invention.

FIG. 13 shows still another embodiment of the invention. In the device of this embodiment, the accumulation of carriers in the shielding gate region 118 due to incident light is suppressed also. An insulating layer 118I is formed along the boundary between each shielding gate region 118 and the channel region 112.

Figure 14:
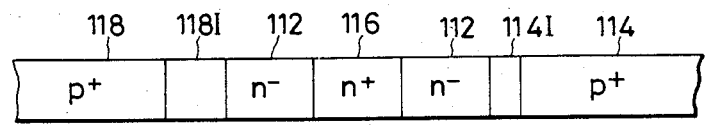
FIG. 14 is an exaplantory diagram showing an energy band structure in the semiconductor photodetector device of FIG. 13.
Figure 14:
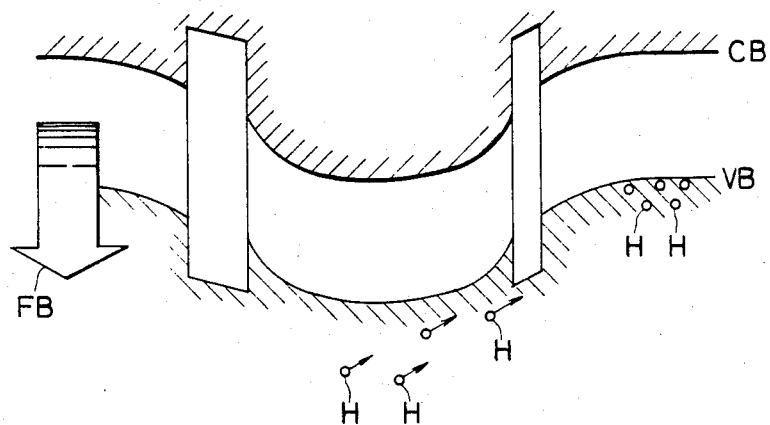

FIG. 14 is an energy band diagram showing energy levels from the p+ layer which forms the control gate region 114 to the shielding gate region 118. A positive voltage is applied to the shielding gate region 118, and therefore the energy levels of the bands VB and CB decrease in the direction of the arrow FB in FIG. 14. Due to a potential barrier formed by the applied voltage and the insulating layer 118I, the accumulation of holes H in the shielding gate region 118 is effectively suppressed, while the accumulation of holes H in the control gate region 114 is accelerated, thus increasing the sensitivity of the cell.

In any one of the above-described embodiments, the channel is formed in the n⁻ layer. The channel may, however, be formed in an intrinsic layer or a p⁻ layer. In the latter case, the conductivity types of the other layers should be suitably changed. Also, the same effects can be obtained even by changing the arrangement of the source and the drain.

The driving transistors 40 may be ordinary transistors. The transistors 40, the read address circuit 30 and the video line selecting circuit 32, together with the image pickup device, may be formed as an integrated circuit.

The device material is preferably silicon, although other materials such as germanium and III-V group compound semiconductor materials can be used if desired.

The SIT may be either a normally off type in which the channel is nonconductive when no voltage is applied to it, that is, when it is thermally balanced, or a normally on type in which the channel is conductive when it is thermally balanced.

If, when carriers are accumulated in the control gates 14 in response to incident light, a negative voltage is applied, then the accumulation of carriers is performed more effectively.

The above-described devices may be driven by any one of the techniques which have been described with reference to FIGS. 4 and 5, and FIG. 8.

In each of the above-described embodiments, each component may be shaped as desired if its function is not impeded. For instance, in the embodiment of FIG. 10, the insulating layer 126 may be covered by the control gate electrode 124. In this case, the voltage applied to the control gate electrode 124 can be more effectively controlled and the masking operations used in the manufacturing process can be more readily achieved.

Further, color picture data may be obtained by forming cell matrices containing photodetector devices for each of red, green and blue. In this case, the incident light is separated into red, green and blue light components using color filters.

The photodetector may be used not only as a line sensor or image sensor, but also as a cell unit.

As is apparent from the above description, according to the invention, means for suppressing the depletion of carriers accumulated in reading data is provided for the gate region or the control gate region, and a resetting operation is carried out against the potential barrier formed by the suppressing means. Accordingly, data can be satisfactorily stored and read out in a nondestructive fashion.

We claim:

1. A semiconductor photodetector composed of static induction transistors including a source region, a drain region and at least one gate region, said gate region forming a boundary with a channel region and in which carriers generated in response to incident light are accumulated, wherein the improvement comprises means for suppressing the depletion of carriers accumulated in reading data by forming a potential barrier provided by an insulating layer formed along said boundary between each of said gate regions and said channel region.

2. The semiconductor photodetector as claimed in claim 1, wherein said suppressing means comprises a second potential barrier applied with a potential which is formed in said gate region after a voltage for eliminating carriers accumulated in said first gate region is applied to said potential barrier provided by said insulating layer.

3. The semiconductor photodetector as claimed in claim 1, wherein each said static induction transistor comprises an additional gate region to which a signal reading reference potential is applied.

4. The semiconductor photodetector as claimed in claim 1, wherein each said static induction transistor comprises an additional gate region to which a signal reading reference potential is applied.

5. The semiconductor photodetector as claimed in claim 2, wherein each said static induction transistor comprises an additional gate region to which a signal reading reference potential is applied.

6. The semiconductor photodetector as claimed in any of claims 3, 4 and 5, wherein said additional gate region comprises means for suppressing the accumulation of carriers generated in response to incident light.

7. The semiconductor photodetector as claimed in any of claims 1, 2, 3, 4 and 5, wherein said static induction transistors are arranged in a one-dimensional array.

8. The semiconductor photodetector as claimed in any of claims 1, 2, 3, 4 and 5, wherein said static induction transistors are arranged in a two-dimensional array.

* * * * *